(12) United States Patent
Watanabe

(10) Patent No.: US 7,292,464 B2
(45) Date of Patent: Nov. 6, 2007

(54) FERROELECTRIC MEMORY DEVICE

(75) Inventor: Kenya Watanabe, Nagano (JP)

(73) Assignee: Seiko Epson Corporation (JP)

( * ) Notice: Subject to any disclaimer, the term of this patent is extended or adjusted under 35 U.S.C. 154(b) by 2 days.

(21) Appl. No.: 11/155,032

(22) Filed: Jun. 16, 2005

(65) Prior Publication Data
US 2005/0286289 A1    Dec. 29, 2005

(30) Foreign Application Priority Data
Jun. 24, 2004   (JP) .............................. 2004-186880

(51) Int. Cl.
*G11C 11/22*   (2006.01)
(52) U.S. Cl. ...................................... 365/145; 265/226
(58) Field of Classification Search ................ 354/145, 354/139, 226
See application file for complete search history.

(56) References Cited

U.S. PATENT DOCUMENTS 6,097,622 A * 8/2000 Shimizu et al. ............. 365/145
6,191,971 B1 * 2/2001 Tanaka et al. ............... 365/145
6,490,189 B1 * 12/2002 Kang et al. .................. 365/145
6,809,954 B1 * 10/2004 Madan et al. ................ 365/145
2003/0185041 A1 * 10/2003 Takahashi et al. ........... 365/145
2003/0218898 A1 * 11/2003 Rickes et al. ................ 365/145

FOREIGN PATENT DOCUMENTS

JP   2001-076493   3/2001

* cited by examiner

*Primary Examiner*—Thong Q. Le
(74) *Attorney, Agent, or Firm*—Harness, Dickey & Pierce, P.L.C.

(57) ABSTRACT

A ferroelectric memory device is characterized in having a first n-type MOS transistor having a gate connected to a word line, a ferroelectric capacitor having one end connected through the first n-type MOS transistor to a bit line, and another end connected to a plate line, and a plate line control circuit that drives the plate line, wherein the plate line control circuit includes an inverter having a first p-type MOS transistor and a second n-type MOS transistor, and an output terminal connected to the plate line, a voltage source that supplies a voltage to be supplied to a source of the first p-type MOS transistor, and a third n-type MOS transistor provided between the voltage source and the output terminal.

4 Claims, 9 Drawing Sheets

FERROELECTRIC MEMORY DEVICE

RELATED APPLICATIONS

The present application claims priority to Japanese Patent Application No. 2004-186880 filed Jun. 24, 2004 which is hereby expressly incorporated by reference herein in its entirety.

BACKGROUND

1. Technical Filed

The present invention relates to ferroelectric memory devices. In particular, the present invention relates to ferroelectric memory devices with less deterioration caused by fatigue and imprint.

2. Related Art

A conventional ferroelectric memory device is described in Japanese Laid-open Patent Application 2001-76493. The conventional ferroelectric memory device has a dropped voltage power supply circuit that lowers an external power supply, which is structured such that a dropped voltage power supply Vint is supplied to a bit line and a plate line, and a potential Vboot that is stepped up by a threshold voltage Vt of a cell transistor than the dropped voltage power supply Vint or higher is supplied to a word line, whereby deterioration of the ferroelectric characteristics by fatigue and imprint is prevented.

However, because the aforementioned conventional ferroelectric memory device needs to have circuits that generate a dropped voltage power supply and a stepped up voltage power supply, there are problems in that its circuit size becomes larger, and its power consumption increases.

Accordingly, it is an object of the present invention to provide a ferroelectric memory device that can solve the problems described above. The object can be achieved by combinations of characteristics recited in independent claims in the scope of patent claims. Also, dependent claims further define advantageous concrete examples of the present invention.

SUMMARY

To achieve the object described above, in accordance with a first embodiment of the present invention, there is provided a ferroelectric memory device equipped with a word line, a bit line and a plate line, and the ferroelectric memory device is characterized in comprising: a first n-type MOS transistor having a gate connected to the word line; a ferroelectric capacitor having one end connected through the first n-type MOS transistor to the bit line, and another end connected to the plate line; and a plate line control circuit that drives the plate line, wherein the plate line control circuit includes an inverter having a first p-type MOS transistor and a second n-type MOS transistor and an output terminal connected to the plate line, a voltage source that supplies a voltage to be supplied to a source of the first p-type MOS transistor, and a third n-type MOS transistor provided between the voltage source and the output terminal. A threshold voltage of the third n-type MOS transistor may preferably be generally equal to a threshold voltage of the first n-type MOS transistor.

With the structure described above, the voltage that is supplied to the plate line when data "0" is written in the ferroelectric capacitor, in other words, the voltage that is supplied to the other end of the ferroelectric capacitor becomes closer to the voltage that is supplied to the one end of the ferroelectric capacitor when writing data "1." Accordingly, with the structure described above, the voltage applied to the ferroelectric capacitor when writing data "0" in the ferroelectric capacitor can be brought closer to the voltage that is applied to the ferroelectric capacitor when writing data "1," such that occurrence of imprint phenomenon can be suppressed.

In particular, when threshold voltages of the first n-type MOS transistor and the third n-type MOS transistor are made generally equal to each other, voltages that are applied to the ferroelectric capacitor when writing data "0" and writing data "1" in the ferroelectric capacitor can be made generally equal to each other, such that occurrence of imprint phenomenon can be further suppressed.

Also, with the structure described above, the voltage that is applied to the ferroelectric capacitor can be lowered, such that deterioration of the characteristics of the ferroelectric capacitor due to fatigue can be suppressed.

Furthermore, with the structure described above, when the plate line is selected, a predetermined voltage is supplied to the plate line through the third n-type MOS transistor, and when the plate line is not selected, a low voltage, such as, for example, a ground voltage is supplied to the plate line through the second n-type MOS transistor. Accordingly, with the structure described above, the plate line can be prevented from becoming a floating state when the plate line is not selected, such that deterioration of data written in the ferroelectric capacitor can be prevented.

In the ferroelectric memory device described above, the word line may preferably be connected to a gate of the third n-type MOS transistor.

With the structure described above, when a specified word line is selected, a predetermined voltage is supplied to a plate line corresponding to the word line through the third n-type MOS transistor. Accordingly, with the structure described above, a composition that controls the third n-type MOS transistor can be considerably simplified.

In the ferroelectric memory device described above, a transfer gate formed from the plate line control circuit, the third n-type MOS transistor and the second p-type MOS transistor may preferably be included.

With the structure described above, a predetermined voltage is supplied to the plate line through one of the third n-type MOS transistor and the second p-type MOS transistor. Accordingly, with the structure described above, the voltage to be supplied to the plate line can be changed according to requirements with a considerably simple composition.

The ferroelectric memory device described above may preferably be further equipped with a control circuit for supplying the voltage to the plate line through the third n-type MOS transistor when writing data in the ferroelectric capacitor, and for supplying the voltage to the plate line through the second p-type MOS transistor when reading data written in the ferroelectric capacitor.

With the structure described above, different voltages can be supplied to the plate line when data is written in the ferroelectric capacitor and when data is read from the ferroelectric capacitor, respectively. In other words, with the structure described above, when data is written in the ferroelectric capacitor, a voltage to be applied to the ferroelectric capacitor can be made generally constant regardless of data to be written, and when data is read from the ferroelectric capacitor, a voltage that is greater than the above voltage can be applied to the ferroelectric capacitor. Accordingly, with the structure described above, when data is written in the ferroelectric capacitor, voltages to be applied to the ferroelectric capacitor can be made generally constant regardless of data to be written such that imprint phenomenon can be suppressed, and when data is read from the ferroelectric capacitor, a read-out voltage of the bit line can be made larger such that a sufficient read-out margin can be obtained.

Also, with the structure described above, when the ferroelectric memory device is in a normal use or in an examination, the voltage to be applied to the ferroelectric capacitor is made generally constant, and for example, when the ferroelectric capacitor is tested for imprint characteristics or the like, the voltage to be applied to the ferroelectric capacitor can be changed depending on data.

In accordance with a second embodiment of the present invention, there is provided a ferroelectric memory device equipped with a word line, a bit line and a plate line, and the ferroelectric memory device is characterized in comprising: an n-type MOS transistor having a gate connected to the word line; a ferroelectric capacitor having one end connected to the bit line through the n-type MOS transistor, and another end connected to the plate line; a plate line control circuit that drives the plate line; and a transfer gate provided between the plate line and the plate line control circuit.

DETAILED DESCRIPTION

Embodiments of the present invention are described in detail below with reference to the drawings, but the embodiments below do not limit the invention concerning the scope of patent claims, and all combinations of the characteristics described in the embodiments are not necessarily indispensable to the means for solution of the invention.

Figure 1:
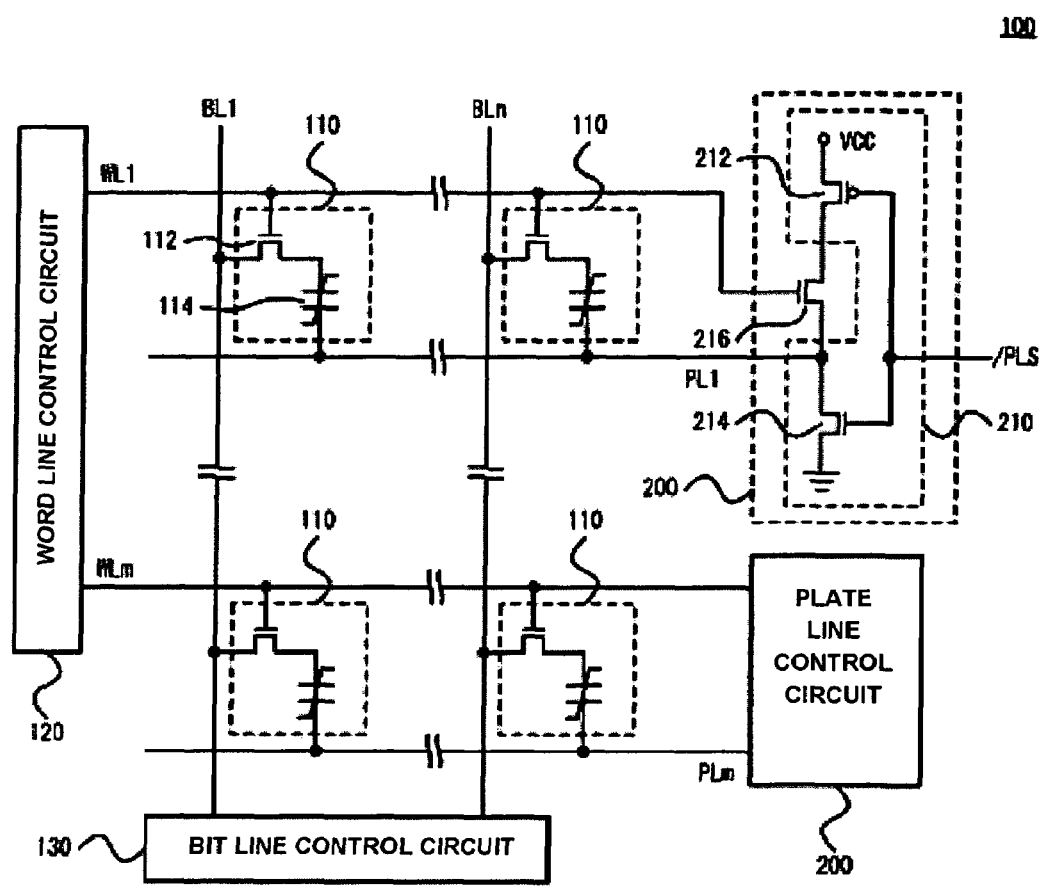
FIG. 1 is a diagram indicating a ferroelectric memory device 100 in accordance with a first embodiment of the present invention.

FIG. 1 is a diagram showing a ferroelectric memory device 100 in accordance with a first embodiment of the present invention. The ferroelectric memory device 100 is equipped with a plurality of memory cells 110, a word line control circuit 120, a bit line control circuit 130, a plate line control circuit 200, m number of (m is a positive integer) word lines WL1-m and plate lines PL1-m, and n number of (n is a positive integer) bit lines BL1-n.

Each of the memory cells 110 stores predetermined data. Each of the memory cells 110 is connected to a predetermined word line WLj (j is an integer of 1–m), a predetermined plate line PLj, and a predetermined bit line BLk (k is an integer of 1–n). Also, each of the memory cells 110 is composed of an n-type MOS transistor 112 and a ferroelectric capacitor 114.

The n-type MOS transistor 112 has a gate connected to the word line WLj, one of source and drain connected to the bit line BLk, and the other connected to one end of the ferroelectric capacitor 114. In other words, the n-type MOS transistor 112 switches as to whether or not the bit line BLk is to be connected to the one end of the ferroelectric capacitor 114 based on a potential on the word line WLj connected to its gate.

The ferroelectric capacitor 114 stores predetermined data according to a potential difference between one end and the other end thereof in accordance with the present embodiment, the ferroelectric capacitor 114 stores data "1" when the potential on the bit line BLk with respect to the plate line PLj as reference becomes a coercive voltage Vc of the ferroelectric capacitor 114 or greater, and stores data "0" when the potential on the plate line PLj with respect to the bit line BLk as reference becomes the coercive voltage Vc or greater. In other words, the ferroelectric capacitor 114 stores data "0" when a potential difference with respect to its one end as reference becomes +Vc or greater, and stores data "1" when the potential difference becomes −Vc or lower.

The word line control circuit 120 selects a specified word line WLj from among the plurality of word lines WL1-m. Concretely, the word line control circuit 120 selects the word line WLj by supplying an operation voltage VCC to the word line WLj. In another example, the word line control circuit 120 may supply a voltage greater than the operation voltage VCC to the word line WLj by using a voltage step-up device such as a boost trap circuit, a step-up circuit or the like.

The bit line control circuit 130 supplies 0V or VCC to the bit line BLk among the plurality of bit lines BL1-n, which is connected to a memory cell 110 to which data is written, thereby writing the data in the memory cell 110. Concretely, the bit line control circuit 130 supplies VCC to the bit line BLk when data "1" is to be written in the memory cell 110 connected to the bit line BLk, and supplies 0V to the bit line BLk when data "0" is to be written therein. In the present embodiment, the n-type MOS transistor 112 has a threshold voltage that is Vth, such that, when the operation voltage VCC is supplied to the bit line BLk when the word line WLj is selected, a voltage VCC-Vth is supplied to the one end of the ferroelectric capacitor 114. Also, the bit line control circuit 130 has a sense amplifier, which determines data stored in the memory cell 110 based on a potential on the bit line BLk.

The plate line control circuit 200 is formed from an inverter 210 composed of a p-type MOS transistor 212 and an n-type MOS transistor 214, and an n-type MOS transistor 216. The plate line control circuit 200 is provided for each of the plate lines PL1-m.

A plate line selection signal /PLS is supplied as an input to the inverter 210. The inverter supplies a predetermined voltage to the plate line PLj based on the potential of the plate line selection signal /PLS. Concretely, the p-type MOS transistor 212 has a source to which VCC, that is an example of a voltage supply, is supplied, a gate to which the plate line selection signal /PLS is supplied, and a drain to which VCC is supplied based on the potential of the plate line selection signal /PLS.

The n-type MOS transistor 216 has a source connected to an output terminal of the inverter 210, a drain connected to the drain of the p-type MOS transistor 212, and a gate connected to the word line WLj. Also, the threshold voltage of the n-type MOS transistor 216 may preferably be generally equal to the threshold voltage Vth of the n-type MOS transistor 112 provided at the memory cell 110. In the present embodiment, the threshold voltage of the n-type MOS transistor 216 is Vth that is equal to the threshold voltage of the n-type MOS transistor 112, and the n-type MOS transistor 216 supplies a voltage VCC-Vth to the output terminal according to the potential on the word line WLj connected to its gate.

The n-type MOS transistor 214 has a source grounded, and a gate to which the plate line selection signal /PLS is supplied, and supplies 0V to the output terminal of the inverter 210, in other words, 0V to the plate line PLj, based on the potential of the plate line selection signal /PLS.

In other words, during a period in which data is written in the memory cell 110, the plate line control circuit 200 supplies a voltage VCC-Vth to the plate line PLj when the potential on the word line WLj and the plate line selection signal /PLS become 0V, and grounds the plate line PLj when the potential of the plate line selection signal /PLS is VCC.

Figure 2:
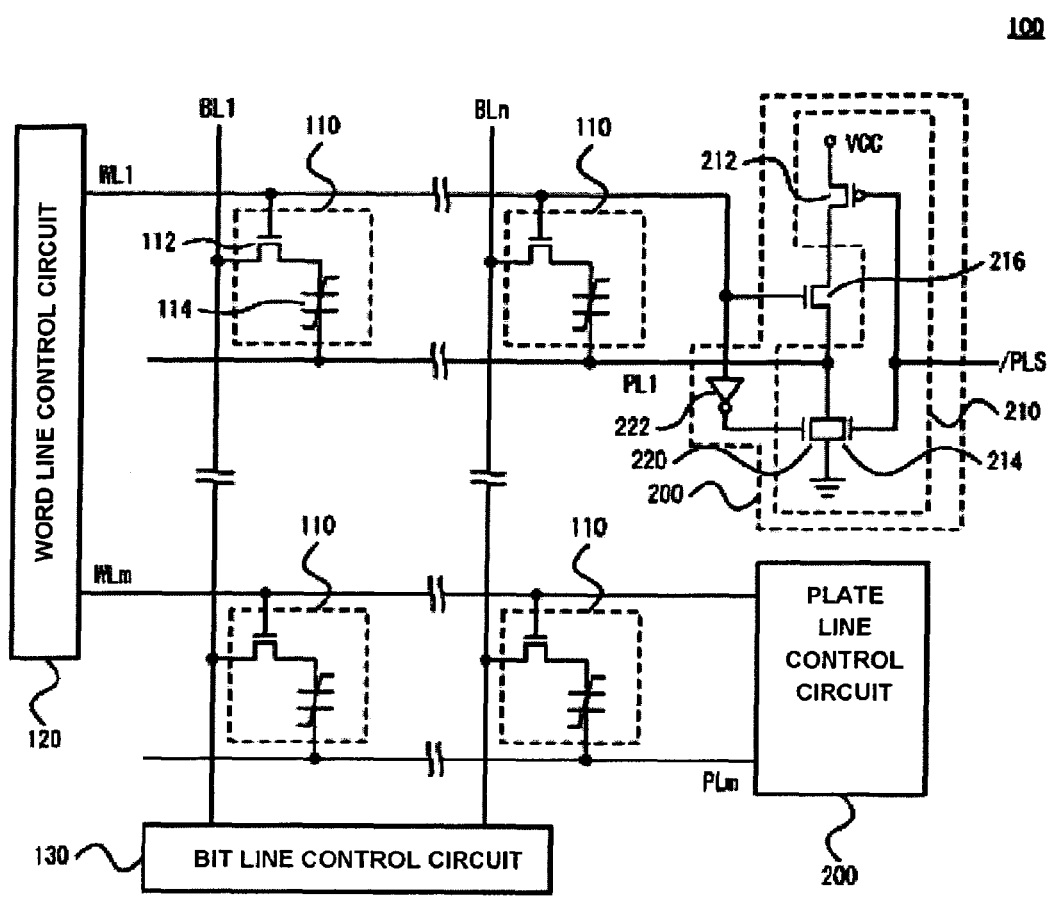
FIG. 2 is a diagram indicating another example of the ferroelectric memory device 100 in accordance with the first embodiment.

FIG. 2 is a diagram of another example of the ferroelectric memory device 100 in accordance with the first embodiment. In the present example, the plate line control circuit 200 further includes an n-type MOS transistor 220 and an inverter 222. The n-type MOS transistor 220 has a source and a drain that are connected to the source and the drain of the n-type MOS transistor 214, respectively. Also, the n-type MOS transistor 220 has a gate to which an output of the inverter 222 is supplied. The inverter 222 has an input terminal connected to the word line WLj, and an output terminal connected to the gate of the n-type MOS transistor 220. In other words, the n-type MOS transistor 220 switches as to whether or not the output terminal of the inverter 210 is grounded according to the potential on the word line WLj.

According to the present example, the n-type MOS transistor 220 switches as to whether or not the plate line PLj is to be grounded according to the potential on the word line WLj, such that the plate line PLj is securely prevented from becoming a floating state.

Figure 3:
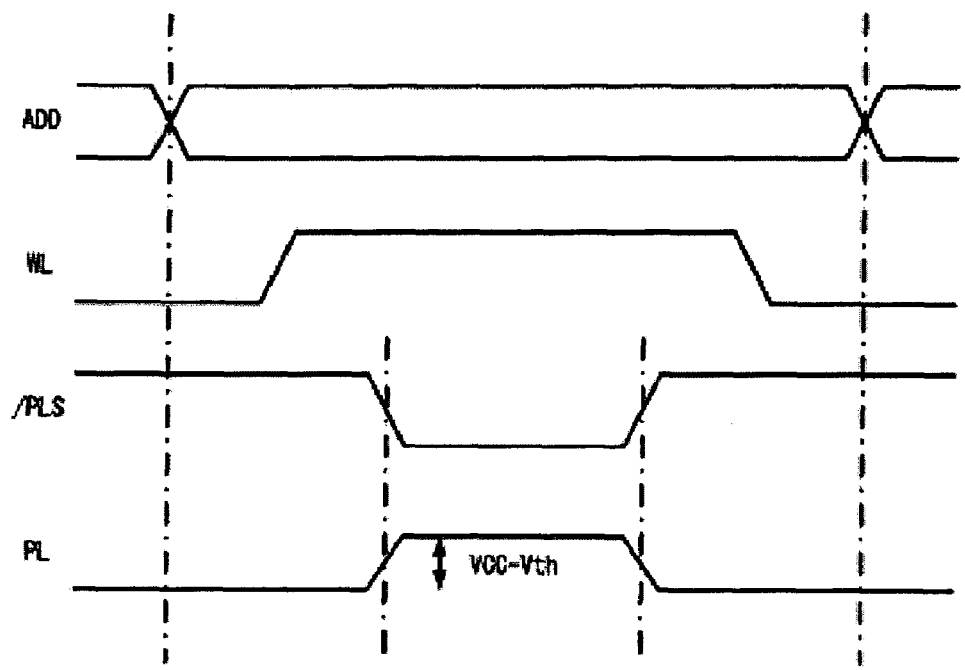
FIG. 3 is a timing chart indicating operations of the ferroelectric memory device 100 in accordance with the first embodiment.

FIG. 3 is a timing chart indicating operations of the ferroelectric memory device 100 in accordance with the first embodiment. Referring to FIGS. 1 to 3, operations of the ferroelectric memory device 100 in accordance with the present embodiment to write predetermined data in the memory cell 110 are described.

First, after an address signal ADD is changed and a specified address is selected; the word line control circuit 120 changes the potential on the word line WLj corresponding to the specified address from 0V to VCC. When the potential on the word line WLj changes to VCC, the n-type MOS transistor 216 becomes conductive, and the drain of the p-type MOS transistor 212 is connected to the output terminal of the inverter 210. On the other hand, at this moment, because the potential of the plate line selection signal /PLS is VCC, the p-type MOS transistor 212 is non-conductive, and the n-type MOS transistor 214 is conductive, such that the potential on the output terminal of the inverter 210 and on the plate line PLj remains to be 0V.

Also, in the example shown in FIG. 2, when the potential on the word line WLj changes from 0V to VCC, the output of the inverter 222 becomes to be 0V, such that the n-type MOS transistor 220 becomes non-conductive. In other words, the n-type MOS transistor 220 is controlled such that the plate line PLj becomes grounded when the potential on the word line WLj is 0V.

Next, when the potential of the plate line selection signal /PLS changes from VCC to 0V, the p-type MOS transistor 212 becomes conductive, and the n-type MOS transistor 214 becomes non-conductive. By this, VCC is supplied to the drain of the n-type MOS transistor 216 that is in a conductive state, and the n-type. MOS transistor 216 supplies to the output terminal of the inverter 210 a voltage VCC-Vth in which VCC is dropped by a threshold voltage Vth of the n-type MOS transistor 216. In other words, the potential on the plate line PLj and the other end of the ferroelectric capacitor 114 provided in the memory cell 110 becomes to be VCC-Vth.

At this moment, when the potential on the bit line BLk is 0V, 0V is supplied to the one end of the ferroelectric capacitor 114 through the n-type MOS transistor 112 provided in the memory cell 110. Accordingly, a voltage +VCC-Vth with respect to the potential on the one end as reference is applied to the ferroelectric capacitor 114, such that data "0" is written.

On the other hand, when the potential on the bit line BLk is VCC, because the threshold voltage of the n-type MOS transistor 112 is Vth, VCC-Vth is supplied to the one end of the ferroelectric capacitor 114 through the n-type MOS transistor 112. Accordingly, the voltage to be applied to the ferroelectric capacitor 114 is generally 0V, such that data written in the ferroelectric capacitor 114 remains to be retained.

When the potential of the plate line selection signal /PLS changes from 0V to VCC, the p-type MOS transistor 212 becomes non-conductive, and the n-type MOS transistor 214 becomes conductive, such that the potential on the plate line PLj becomes 0V. At this moment, because the potential on the word line WLj is VCC, the voltage to be applied to the ferroelectric capacitor 114 becomes to be 0V, when the potential on the bit line BLk is 0V, and data "0" remains to be retained in the ferroelectric capacitor 114.

On the other hand, when the potential on the bit line BLk is VCC, the voltage to be applied to the ferroelectric capacitor 114 becomes to be −(VCC-Vth) with the one end thereof as reference, such that data "1" is written (rewritten) in the ferroelectric capacitor 114.

Next, when the potential on the word line WLj changes from VCC to 0V, the one end of the ferroelectric capacitor 114 is cut off from the bit line BLk, and the potential on the other end thereof remains to be 0V, such that data written in the ferroelectric capacitor 114 remains to be retained. By the operations described above, specified data is written and maintained in the ferroelectric capacitor 114.

Figure 4:
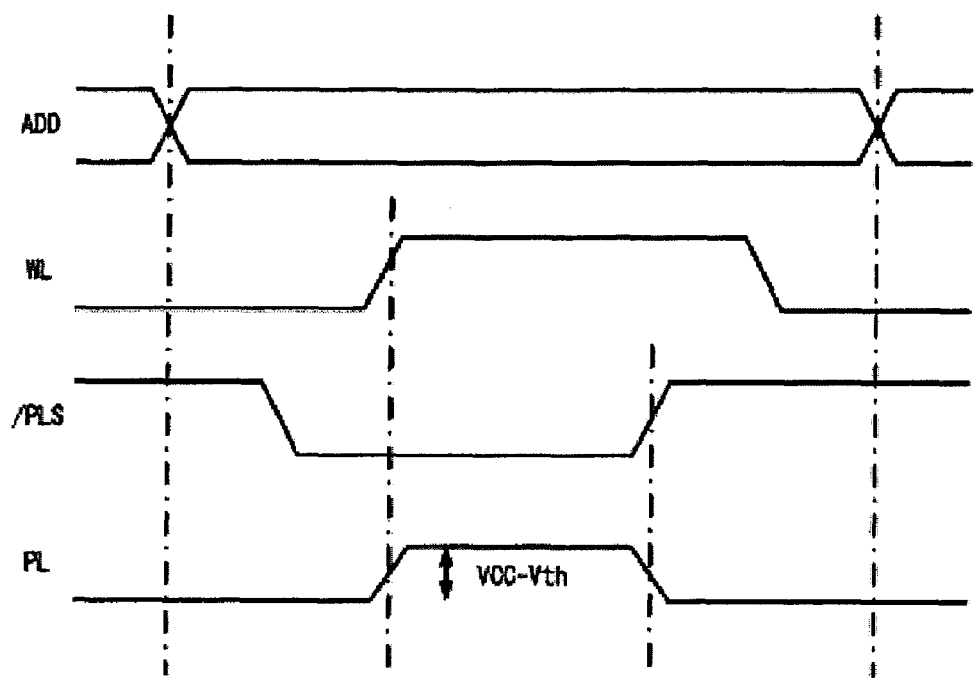
FIG. 4 is a timing chart indicating another example of operations of the ferroelectric memory device 100 in accordance with the present embodiment.

FIG. 4 is a timing chart indicating another example of operations of the ferroelectric memory device 100 in accordance with the present embodiment. As indicated in the figure, before the potential on the word line WLj changes from 0V to VCC, the potential of the plate line selection signal /PLS may be changed from VCC to 0V.

In the present embodiment, the voltage that is supplied to the plate line PLj when writing data "0" in the ferroelectric capacitor 114, in other words, the voltage to be supplied to the other end of the ferroelectric capacitor 114 is generally equal to the voltage that is supplied to the one end of the ferroelectric capacitor 114 when writing data "1" therein. Accordingly, in accordance with the present embodiment, the voltage to be applied to the ferroelectric capacitor 114 when writing data "0" in the ferroelectric capacitor 114 can be made generally equal to the voltage to be supplied to the ferroelectric capacitor 114 when writing data "1" therein, such that occurrence of imprint phenomenon can be suppressed.

Also, in accordance with the present embodiment, the voltage to be applied to the ferroelectric capacitor can be lowered, such that deterioration of the characteristics of the ferroelectric capacitor due to fatigue can be suppressed.

Also, in accordance with the present embodiment, when the plate line PLj is selected, a voltage VCC-Vth is supplied to the plate line PLj through the n-type MOS transistor 216. When the plate line PLj is not selected, the plate line PLj is grounded through the n-type MOS transistor 214. Accordingly, in accordance with the present embodiment, when the plate line PLj is not selected, the plate line PLj can be prevented from becoming a floating state, such that deterioration of data written in the ferroelectric capacitor 114 can be prevented.

Figure 5:
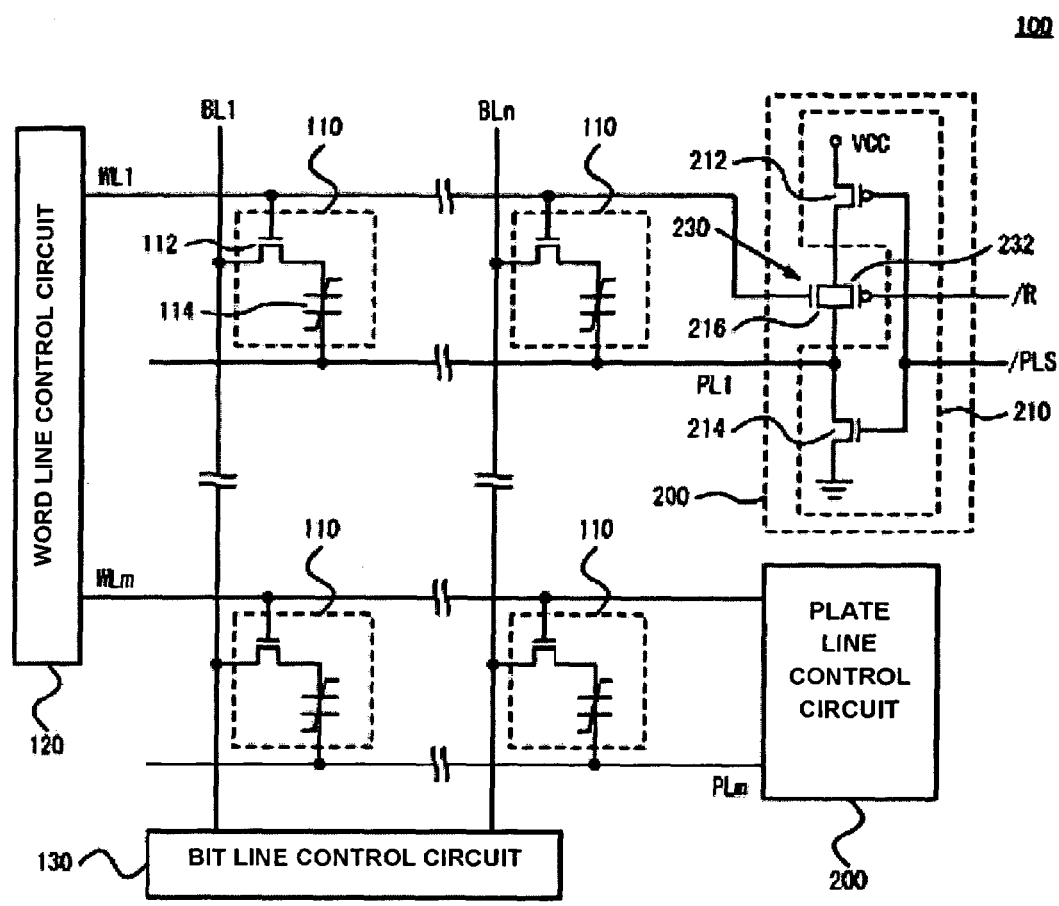
FIG. 5 is a diagram indicating a ferroelectric memory device 100 in accordance with an example of a second embodiment.
Figure 6:
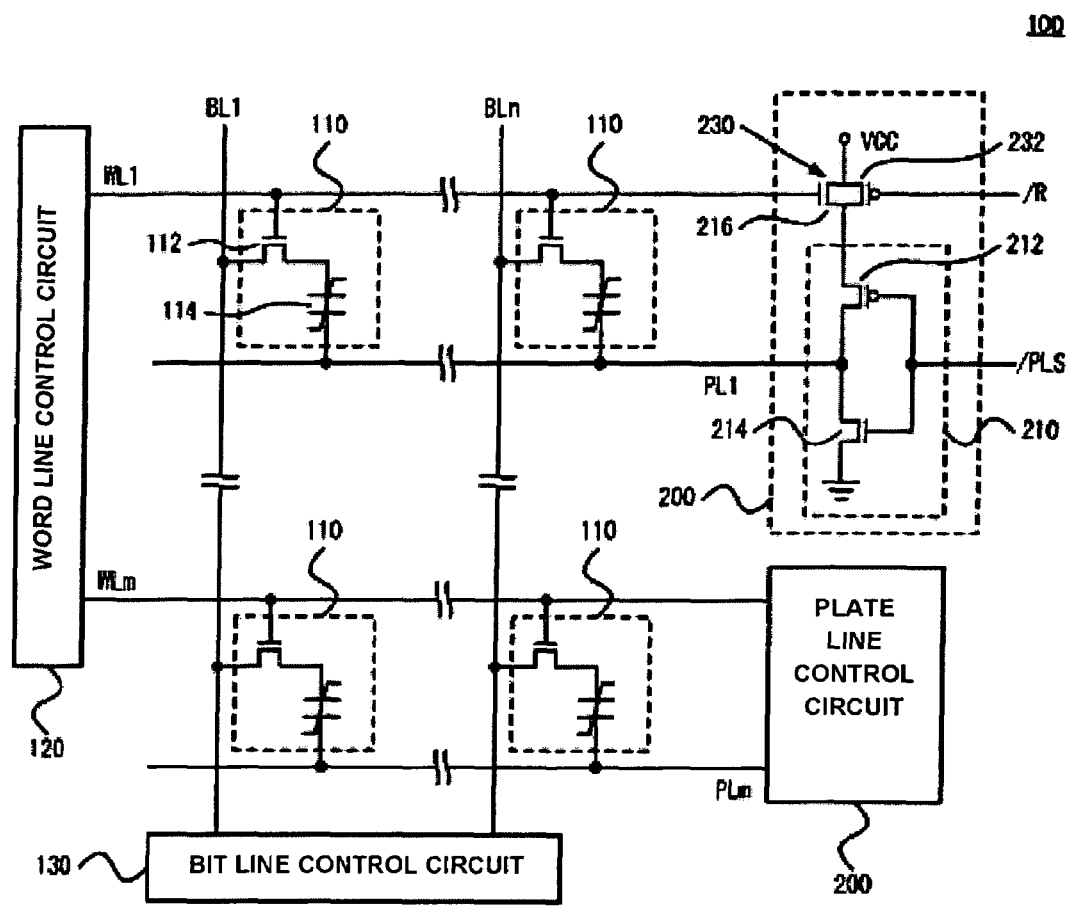
FIG. 6 is a diagram indicating a ferroelectric memory device 100 in accordance with another example of the second embodiment.
Figure 7:
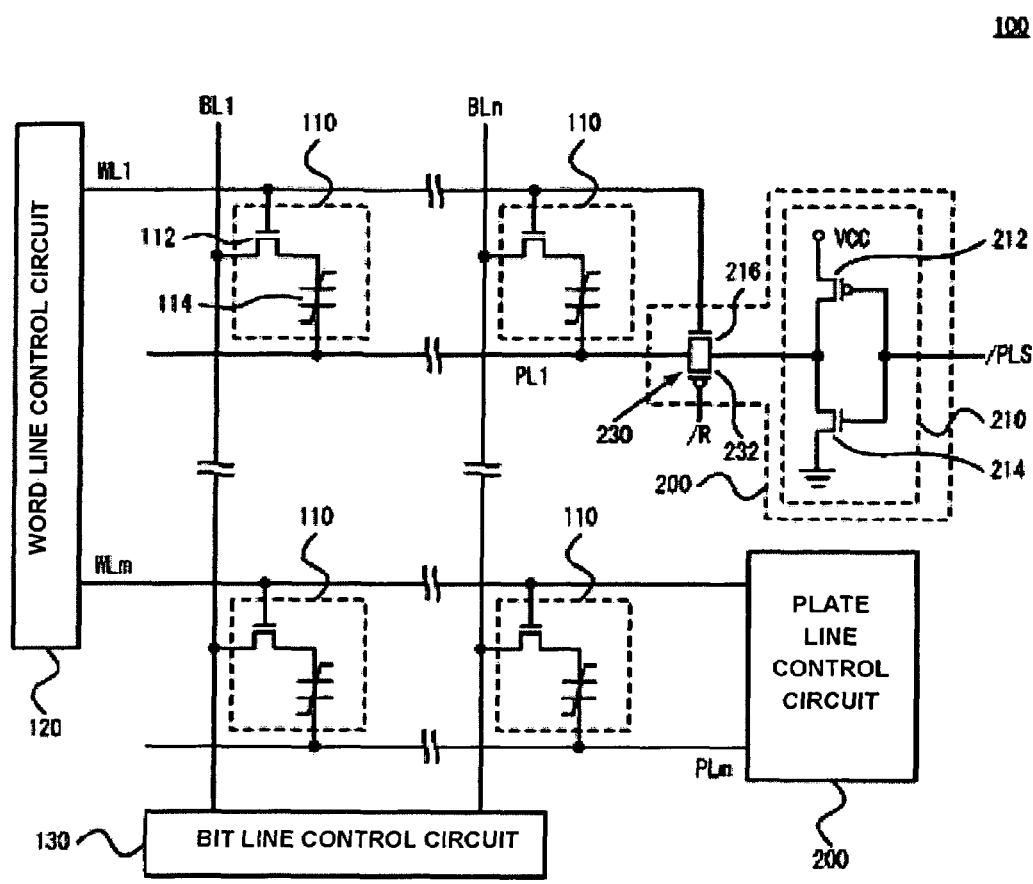
FIG. 7 is a diagram indicating a ferroelectric memory device 100 in accordance with still another example of the second embodiment.

FIGS. 5 through 7 are diagrams showing ferroelectric memory devices 100 in accordance with a second embodiment. The ferroelectric memory devices 100 in accordance with the second embodiment are described below, mainly focusing on differences thereof from the first embodiment. It is noted that components appended with the same reference numbers as those of the first embodiment have functions similar to those of the first embodiment.

In the present embodiment, a plate line control circuit 200 includes a transfer gate 230 provided between VCC and an output terminal of an inverter 210. More specifically, the ferroelectric memory device 100 in accordance with the present embodiment is different from the first embodiment in that the plate line control circuit 200 further includes a p-type MOS transistor 232 having a source connected to a drain of a p-type MOS transistor 212 and a drain of an n-type MOS transistor 216, and a drain connected to an output terminal of the inverter 210 and a source of the n-type MOS transistor 216. As indicated in FIG. 5, the transfer gate 230 may be provided between the p-type MOS transistor 212 and the output terminal of the inverter 210, or may be provided between VCC and the p-type MOS transistor 212. Also, the transfer gate 230 may be provided, as indicated in FIG. 7, between the output terminal of the inverter 210 and a plate line PLj.

A readout control signal /R is supplied to the gate of the p-type MOS transistor 232. In other words, in the ferroelectric memory device 100 in accordance with the present embodiment, at the time of writing operation, the potential on the plate line PLj becomes to be VCC-Vth, like the first embodiment and the second embodiment, but at the time of reading operation, the plate line PLj is selected, and the p-type MOS transistor 232 becomes conductive, such that VCC is supplied to the plate line PLj.

Figure 8:
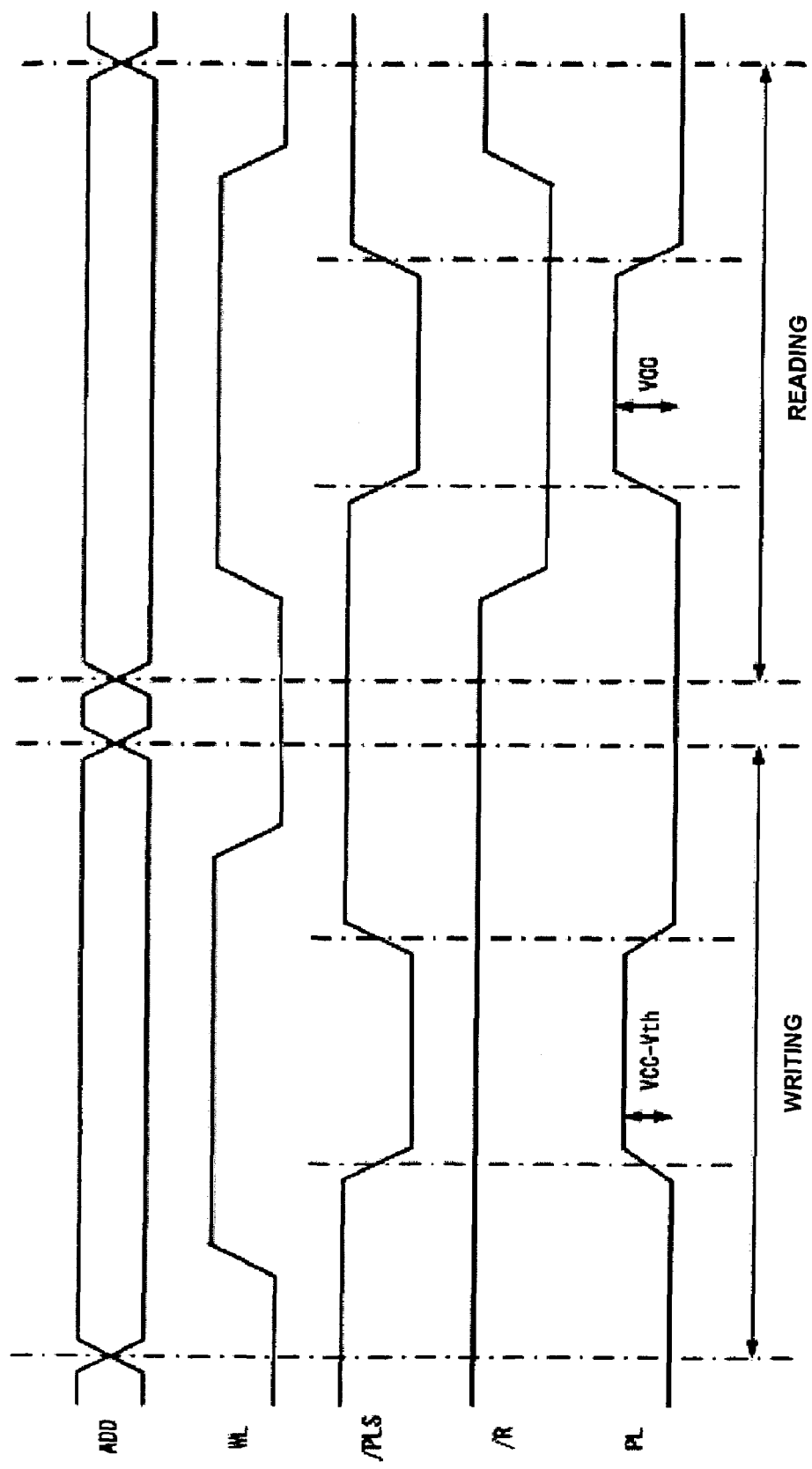
FIG. 8 is a timing chart indicating operations of the ferroelectric memory device 100 in accordance with the second embodiment.

FIG. 8 is a timing chart indicating operations of the ferroelectric memory device 100 in accordance with the second embodiment. Referring to FIGS. 5 through 8, operations of the ferroelectric memory device 100 in accordance with the second embodiment are described. It is noted that, in the present embodiment, the potential of the readout control signal /R is VCC at the time of writing operation. Accordingly, the writing operation of the ferroelectric memory device 100 is generally the same as the writing operation in the first embodiment, and the reading operation of the ferroelectric memory device 100 in accordance with the present embodiment is described below.

First, after the bit line control circuit 130 pre-charges a bit line BLk to 0V, an address signal ADD is changed and a specified address is selected, the word line control circuit 120 changes the potential on a word line WLj corresponding to the specified address from 0V to VCC. Also, the potential of the readout control signal /R changes from VCC to 0V according to the change of the potential on the word line WLj.

When the potential on the word line WLj changes to VCC, the n-type MOS transistor 216 becomes conductive, and thus the n-type MOS transistor 112 provided in the memory cell 110 becomes conductive, such that one end of the ferroelectric capacitor 114 is connected to the bit line BLk. Next, when the potential of the plate line selection signal /PLS changes from VCC to 0V, the p-type MOS transistor 212 becomes conductive, and VCC is supplied to the plate line PLj through the p-type MOS transistors 212 and 232. At this moment, though the n-type MOS transistor 216 is conductive, the p-type MOS transistor 232 without having a voltage drop is also conductive, such that the potential on the plate line PLj becomes to be VCC, but not VCC-Vth.

Accordingly, because a voltage +VCC is applied to the ferroelectric capacitor 114 with its one end as reference, a charge is discharged to the bit line BLk according to data written in the ferroelectric capacitor 114. Then, a sense amplifier (not shown) provided in the bit line control circuit 130 detects a change in the potential on the bit line BLk caused by the charge discharged onto the bit line BLk, and judges the data stored in the ferroelectric capacitor 114.

The sense amplifier determines data stored in the ferroelectric capacitor 114, and sets the potential on the bit line BLk to VCC or 0V. Concretely, the sense amplifier sets the potential on the bit line BLk to VCC when the data stored in the ferroelectric capacitor 114 is "1," and sets the potential on the bit line BLk to 0V when the stored data is "0."

Next, when the potential of the plate line selection signal /PLS changes from 0V to VCC, the potential on the plate line PLj changes from VCC to 0V. At this time, when the data stored in the ferroelectric capacitor 114 is "1," the potential on the bit line BLk is set to VCC, and therefore the voltage applied to the ferroelectric capacitor 114 becomes to be -VCC with the potential on the one end thereof as reference, and data "1" is rewritten in the ferroelectric capacitor 114.

On the other hand, when the data stored in the ferroelectric capacitor 114 is "0," the potential on the bit line BLk is 0V, and therefore the voltage that is applied to the ferroelectric capacitor 114 is generally 0V, such that the data "0" remains to be retained in the ferroelectric capacitor 114.

Figure 9:
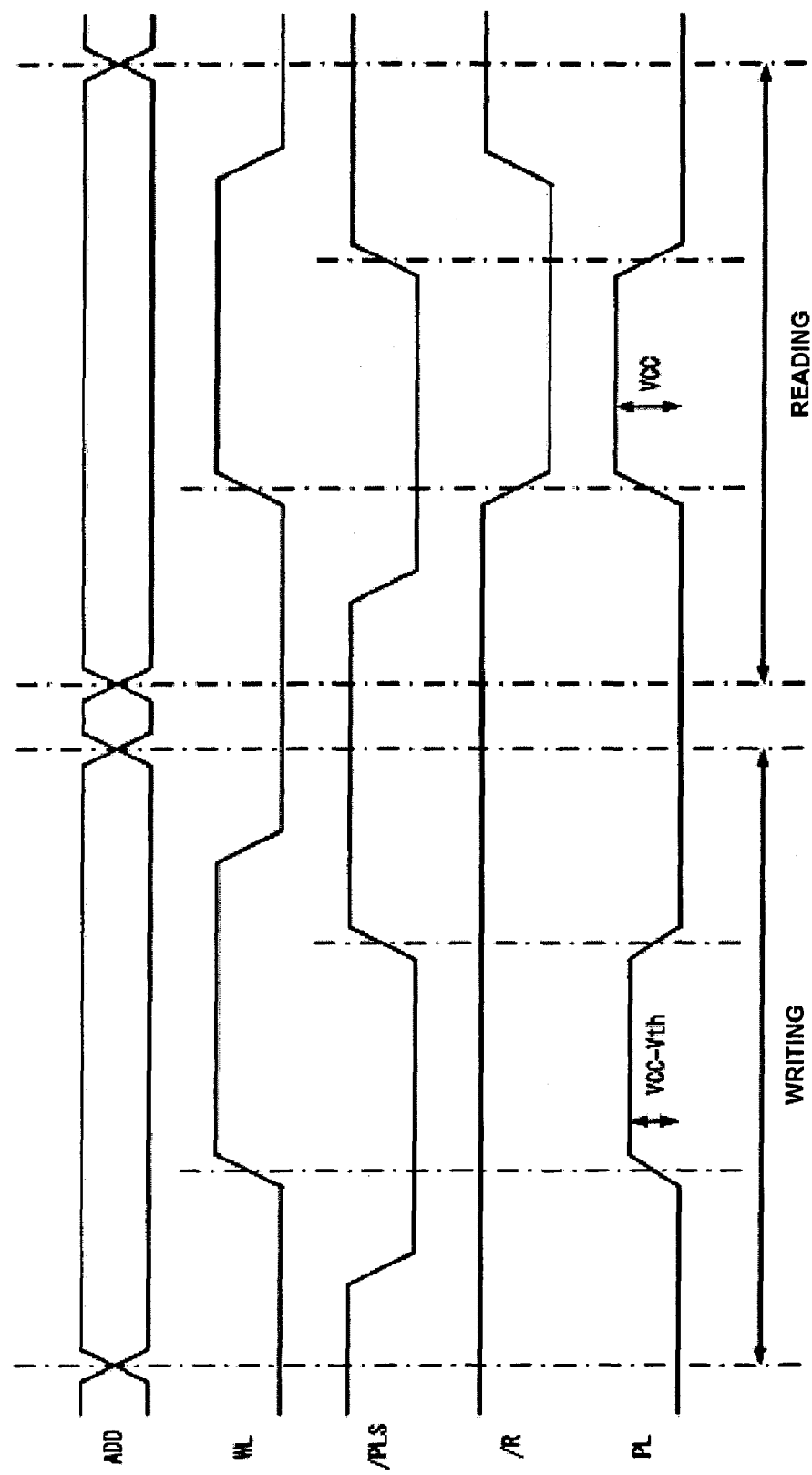
FIG. 9 is a timing chart indicating another example of operations of the ferroelectric memory device 100 in accordance with the present embodiment.

FIG. 9 is a timing chart indicating another example of operations of the ferroelectric memory device 100 in accordance with the present embodiment. As indicated in the figure, at the time of writing and/or reading, before the potential on the work line WLj changes from 0V to VCC, the potential of the plate line selection signal /PLS may be changed from VCC to 0V.

In accordance with the present embodiment, different voltages may be supplied to the plate line PLj when data is written in the ferroelectric capacitor 114 and when data is read from the ferroelectric capacitor 114. In other words, in accordance with the present embodiment, when data is written in the ferroelectric capacitor 114, a voltage to be applied to the ferroelectric capacitor 114 may be made generally constant regardless of data to be written, and when data is read from the ferroelectric capacitor 114, a voltage greater than the above voltage can be applied to the ferroelectric capacitor 114. Accordingly, in accordance with the present embodiment, when data is written in the ferroelectric capacitor 114, the voltage to be applied to the ferroelectric capacitor 114 can be made generally constant so that imprint phenomenon can be suppressed, and when data is read from the ferroelectric capacitor 114, the readout voltage for the bit line BLk can be made greater such that a sufficient readout margin can be obtained.

Also, in accordance with the present embodiment, when the ferroelectric memory device 100 is in a normal use or in an examination, the voltage to be applied to the ferroelectric capacitor 114 may be made generally constant, and for example, when the ferroelectric capacitor 114 is tested for imprint characteristics or the like, the voltage to be applied to the ferroelectric capacitor 114 may be changed according to data.

The embodiment examples and application examples described in accordance with the embodiments of the present invention may be appropriately combined according to usages, or changes or improvements may be added thereto and used, and the present invention is not limited to the description of the above-described embodiments. It is obvious from the description of the scope of patent claims that embodiments with such combinations or those with changes or improvements added thereto can be included in the technical scope of the present invention.

What is claimed is:

1. A ferroelectric memory device equipped with a word line, a bit line and a plate line, the ferroelectric memory device comprising:

a first n-type MOS transistor having a gate connected to the word line;

a ferroelectric capacitor having one end connected through the first n-type MOS transistor to the bit line, and another end connected to the plate line; and a plate line control circuit that drives the plate line, wherein the plate line control circuit includes:

an inverter having a first p-type MOS transistor and a second n-type MOS transistor and an output terminal connected to the plate line, a voltage source that supplies a voltage to be supplied to a source of the first p-type MOS transistor, and a third n-type MOS transistor having a drain connected to a drain of the first p-type MOS transistor and a source connected to the output terminal, and applying a voltage smaller than the voltage source and greater than a threshold voltage to the output terminal, wherein the word line is connected to a gate of the third n-type MOS transistor.

2. The ferroelectric memory device according to claim 1, wherein a threshold voltage of the third n-type MOS transistor is generally equal to a threshold voltage of the first n-type MOS transistor.

3. The ferroelectric memory device according to claim 1, comprising a transfer gate formed from the plate line control circuit, the third n-type MOS transistor and a second p-type MOS transistor.

4. The ferroelectric memory device according to claim 3, further comprising a control circuit for supplying the voltage to the plate line through the third n-type MOS transistor when writing data in the ferroelectric capacitor, and for supplying the voltage to the plate line through the second p-type MOS transistor when reading data written in the ferroelectric capacitor.

* * * * *